United States Patent
Hirai

(10) Patent No.: US 8,527,917 B2
(45) Date of Patent: Sep. 3, 2013

(54) SEMICONDUCTOR CELL FOR PHOTOMASK DATA VERIFICATION AND SEMICONDUCTOR CHIP

(75) Inventor: Takayasu Hirai, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 831 days.

(21) Appl. No.: 12/358,770

(22) Filed: Jan. 23, 2009

(65) Prior Publication Data

US 2009/0193386 A1 Jul. 30, 2009

(30) Foreign Application Priority Data

Jan. 25, 2008 (JP) .................................. 2008-015482

(51) Int. Cl.
G06F 17/50 (2006.01)

(52) U.S. Cl.
USPC ............................................. 716/55; 716/51

(58) Field of Classification Search
USPC .................................................. 716/106–111
See application file for complete search history.

(56) References Cited

U.S. PATENT DOCUMENTS

| 7,108,945 B2 * | 9/2006 | Sutani et al. ...................... 430/5 |
| 7,356,788 B2 * | 4/2008 | Chang et al. ..................... 716/52 |
| 7,669,172 B2 * | 2/2010 | Ito et al. .......................... 716/54 |
| 2007/0124718 A1 * | 5/2007 | Kobayashi et al. ............. 716/19 |

FOREIGN PATENT DOCUMENTS

| JP | 2004-302263 | 10/2004 |
| JP | 2006-303099 | 11/2006 |
| JP | 2007-36290 | 2/2007 |
| JP | 2007-42821 | 2/2007 |

* cited by examiner

Primary Examiner — Binh Tat
(74) Attorney, Agent, or Firm — Dickstein Shapiro LLP

(57) ABSTRACT

A semiconductor cell for photomask data verification is disclosed that is provided in a semiconductor chip having a semiconductor integrated circuit and used for verifying photomask data of the semiconductor chip obtained by performing arithmetic processing on layout data of the semiconductor integrated circuit. The semiconductor cell for photomask data verification has the photomask data obtained by performing the arithmetic processing on the layout data of the semiconductor integrated circuit and is electrically separated from the semiconductor integrated circuit.

5 Claims, 16 Drawing Sheets

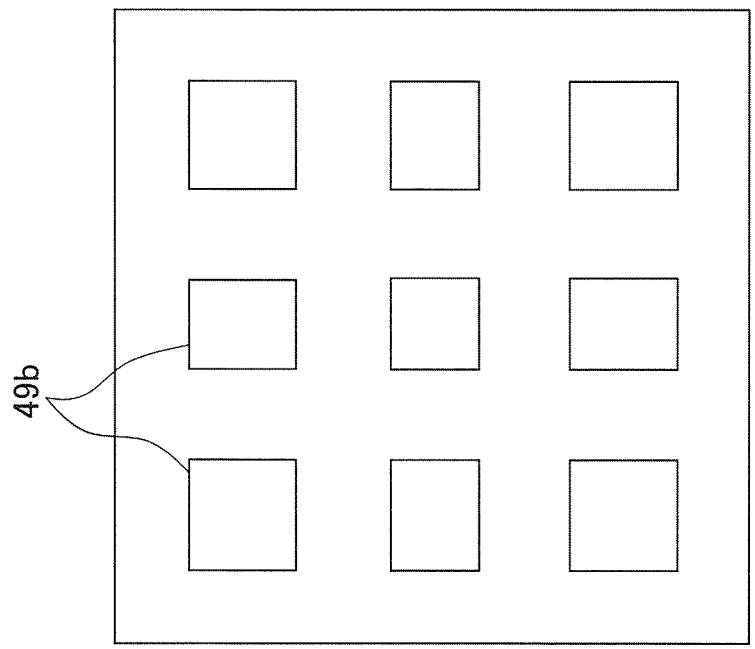
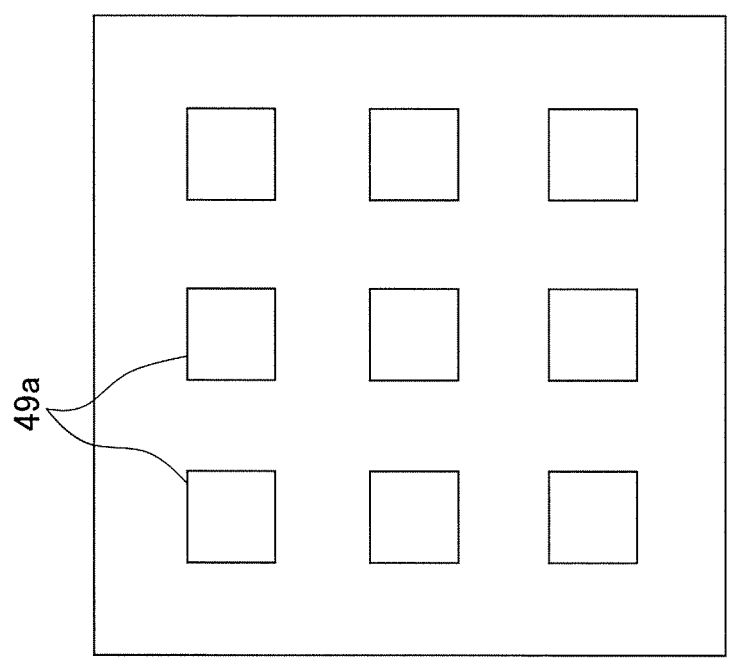

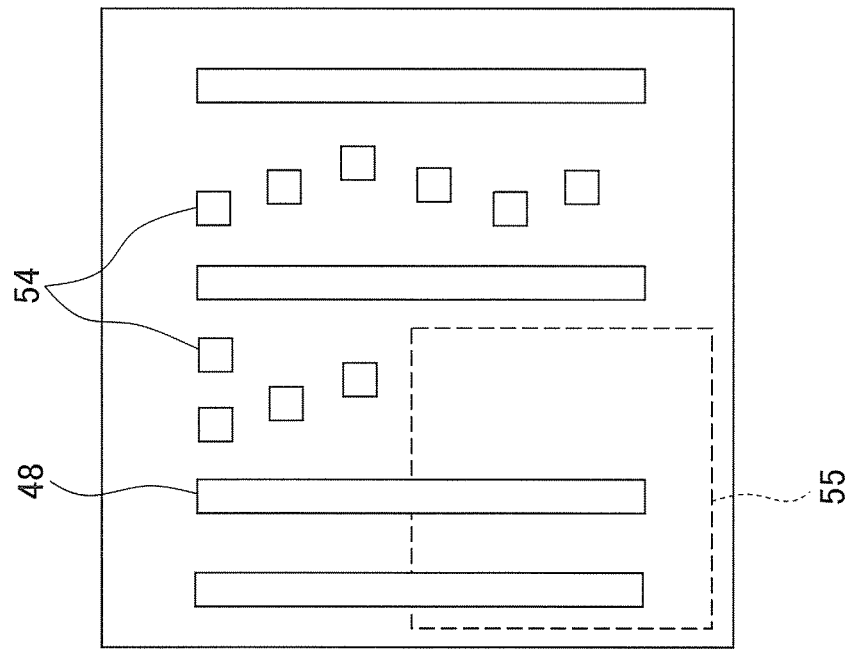
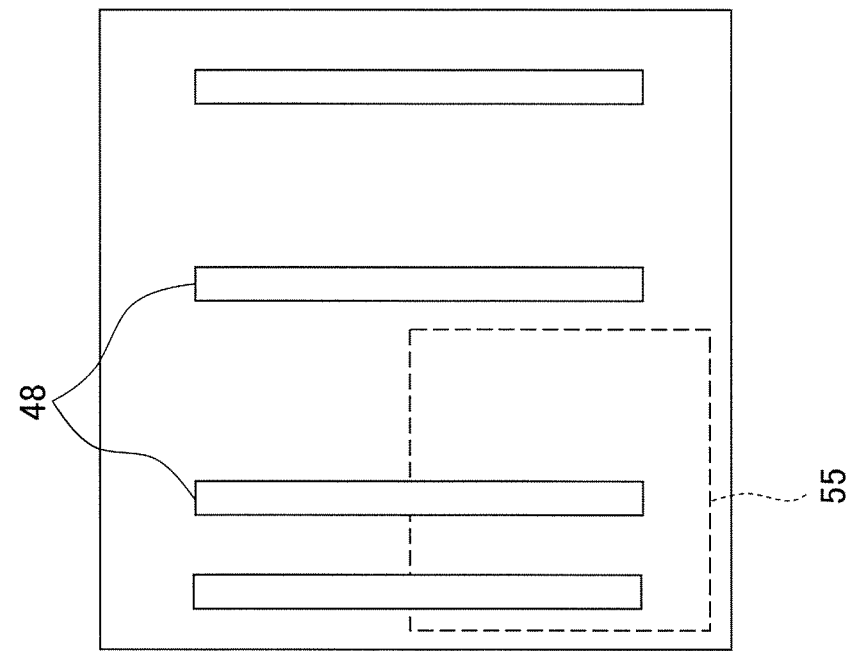

US 8,527,917 B2

SEMICONDUCTOR CELL FOR PHOTOMASK DATA VERIFICATION AND SEMICONDUCTOR CHIP

BACKGROUND OF THE INVENTION

1. Field of the Invention

The present invention generally relates to semiconductor cells for photomask data verification and semiconductor chips and, in particular, to a semiconductor cell for photomask data verification and a semiconductor chip for verifying photomask data obtained by performing arithmetic processing on the layout data of semiconductor integrated circuits included in the semiconductor chip.

2. Description of the Related Art

As electronic equipment has become more advanced and compact in recent years, it is desired that various LSIs be more highly integrated. A semiconductor chip constituting the LSI is manufactured through multiple processes such as a photomask data generation process for generating photomask data based on a function design, a logic design, a circuit design, and a layout design; a photomask manufacturing process for manufacturing the photomask using the generated photomask data; and a semiconductor chip manufacturing process including, for example, an operation of transferring a photomask pattern onto a silicon wafer by reduced projection exposure using the manufactured photomask.

Particularly, in order to manufacture the highly-integrated semiconductor chip, it is necessary to use a photomask composed of multiple pieces of masks to form a highly-integrated pattern on a silicon wafer. Therefore, the importance of element technology for manufacturing the photomask is increased.

As a procedure for manufacturing the photomask, layout data are first generated based on a circuit design. Then, photomask data are generated based on the obtained layout data. After that, the photomask is manufactured based on the obtained photomask data.

The layout data are so-called CAD data and have layout information of circuit elements included in the semiconductor integrated circuits of a semiconductor chip. The layout data have the data of plural layers and are used for generating photomask data. As a format of the layout data, a GDS format, etc., are known.

Furthermore, the photomask data are used for generating the photomask. In order to generate the photomask data, necessary data are selected from the layout data in the GDS format, etc., or combined with each other, and then subjected to arithmetic processing. The photomask data contain mask data corresponding to the data of the respective layers of the layout data. Here, it is defined that the mask data represent data corresponding to one piece of mask in the photomask composed of multiple pieces of the masks, and the photomask data represent data corresponding to the whole photomask having the multiple pieces of masks as the data of the respective layers. As a format of the photomask data, MEBES, JEOL, etc., are known.

Note that in some cases, the photomask data are called Job Deck Files and the verification of the photomask data is called Job Deck View.

Conventionally, arithmetic processing for converting the layout data into the photomask data has been performed relatively easily, because the data of one layer among the layout data generally correspond to the mask data of one piece of mask of the photomask data. In recent years, however, the data of the plural layers are generally subjected to the arithmetic processing to generate the mask data of the one piece of mask. Therefore, the arithmetic processing becomes more complicated.

For example, in some cases, complicated arithmetic processing is performed to make uniform the arrangement of the semiconductor integrated circuits on the whole silicon wafer. Specifically, in order to maintain the flatness of the surface of a metal wiring layer included in the semiconductor integrated circuits, Patent Document 1 discloses an example of a semiconductor integrated circuit device. That is, in the semiconductor integrated circuit device, the circuit elements typically included in the semiconductor integrated circuits are provided and connected to each other. Furthermore, besides metal wirings for supplying power to the circuit elements, metal wirings called dummy metals that do not have a specific electrical function are also provided. As a result, the arrangement of the metal wirings is made uniform.

Furthermore, even if the layout data are derived from the same circuit elements, the number of the layers to be used is different depending on the presence or absence of options. Therefore, in some cases, it is necessary to perform the complicated arithmetic processing. FIG. 1 is a plan view showing the circuit configuration of a conventional semiconductor chip. As shown in FIG. 1, the semiconductor chip 110 has regions where the semiconductor integrated circuits such as a digital circuit 121, a SRAM circuit 122, an analog circuit 123, an I/O cell circuit 124, a high voltage circuit 125, and other circuits 126 are arranged. In the respective regions where the semiconductor integrated circuits are arranged, option layers peculiar to the circuits are used in some cases.

In addition, as the number of the layers increases, there is a high likelihood of the option layer being erroneously selected or the arithmetic processing being erroneously performed in the photomask data generating process in which the layout data are subjected to the arithmetic processing to obtain the photomask data. As a result, the photomask data are not be properly generated. If these improperly generated photomask data are directly used to manufacture the photomask and the semiconductor chip manufacturing process is performed, defective semiconductor chips are manufactured.

Accordingly, with respect to the obtained photomask data, it is necessary to be able to easily verify whether the layout data serving as a basis for the photomask data are properly subjected to the arithmetic processing.

In general, however, the layout data of the respective semiconductor integrated circuits of the semiconductor chip are generated by different designers. Therefore, it is time-consuming and inefficient to specify a part to be used for verifying the arithmetic processing from the photomask data of the semiconductor integrated circuits after performing the arithmetic processing for converting the layout data into the photomask data.

Accordingly, it is necessary to provide a unit for efficiently verifying the photomask data of the semiconductor integrated circuits included in the semiconductor chip.

Here, as an example of the unit for efficiently verifying the data of the layers of the layout data or the photomask data of the semiconductor chip, the layout data of the semiconductor integrated circuits included in the semiconductor chip are extracted and integrated together as a semiconductor cell different from the semiconductor integrated circuits. Specifically, a process monitor and a revision mark are used as such.

First, the process monitor is a semiconductor cell for verifying the shape of the semiconductor chip after manufacture. Referring to FIG. 2, a process monitor 130 is described. As shown in FIG. 2, the process monitor 130 is generally provided in a scribe region 131 at the periphery of a semiconductor chip 110. In the process monitor 130, shapes formed by the layers used in the semiconductor chip 110 and the circuit elements are formed. Some process monitors are used for verification at a FAB (semiconductor process factory) during a processing operation. Other process monitors are used for measuring electrical characteristics in such a manner as to bring the probe needle of a prober into contact with a pad on the wafer.

Furthermore, the revision mark is a semiconductor cell for displaying the revision history of the layers used for layout. Referring to FIGS. 3A and 3B, the revision mark is described. As shown in FIG. 3A, a semiconductor integrated circuit region 132 is provided at the central part of the semiconductor chip 110, and a revision mark 133 is provided at the peripheral part. As shown in FIG. 3B, in the revision mark 133, numbers indicating the revision history of the respective mask data constituting the photomask data of the semiconductor chip 110 are displayed in an integrated manner. For example, if the photomask data are composed of the data of four layers corresponding to four pieces of masks and the data of the first through third layers refer to version A and the data of the fourth layer refer to version B, the numbers of "LAY1A," "LAY2A," "LAY3A," and "LAY4B" are displayed so as to be adjacent to each other in the data of the respective layers. Consequently, as shown in FIG. 3B, the revision mark 133, in which the numbers indicating the revision history of the data of the respective layers are displayed in an integrated manner, is provided in the photomask data.

Patent Document 1: JP-A-2007-36290

However, in order to efficiently verify an error in the results of the arithmetic processing in the photomask data obtained by performing the arithmetic processing on the layout data, if conventional methods are used to extract the layout data of the semiconductor integrated circuits included in the semiconductor chip and integrate them together as the semiconductor cell different from the semiconductor integrated circuits, the following problem arises.

When an error in the results of the arithmetic processing on the photomask data is verified using the process monitor, the process monitor is the semiconductor cell for performing the verification after the photomask is manufactured and the manufacturing process is started. Therefore, even if an error is found in the results of the arithmetic processing, the photomask has to be manufactured again, which in turn causes unnecessary operations and costs. In addition, because the process monitor is not the semiconductor cell for verifying the photomask data, the circuit elements included in the semiconductor integrated circuits of the semiconductor chip represented by the photomask data are not integrated together. Therefore, it is difficult to determine whether all the layout data of the circuit elements included in the semiconductor integrated circuits of the semiconductor chip are properly subjected to the arithmetic processing.

Furthermore, when an error in the results of the arithmetic processing on the photomask data is verified using the revision mark, the revision mark is not the semiconductor cell that reproduces the layout data of the semiconductor integrated circuits of the semiconductor chip. Therefore, it is difficult to determine whether all the layout data of the circuit elements included in the semiconductor integrated circuits of the semiconductor chip are properly subjected to the arithmetic processing.

SUMMARY OF THE INVENTION

The present invention has been made in view of the above problems and may provide a semiconductor cell for photomask data verification and a semiconductor chip for easily verifying the photomask data obtained by performing the arithmetic processing on layout data.

In order to solve the above problems, the present invention provides the following configurations.

According to an aspect of the present invention, there is provided a semiconductor cell for photomask data verification that is provided in a semiconductor chip having a semiconductor integrated circuit and used for verifying photomask data of the semiconductor chip obtained by performing arithmetic processing on layout data of the semiconductor integrated circuit. The semiconductor cell for photomask data verification has the photomask data obtained by performing the arithmetic processing on the layout data of the semiconductor integrated circuit and is electrically separated from the semiconductor integrated circuit.

Preferably, the layout data of the semiconductor integrated circuit including plural layers may have some of or all data of the plural layers of the semiconductor integrated circuit.

Preferably, the layout data of the semiconductor integrated circuit including plural layers may have layout data of all types of circuit elements constituting the semiconductor integrated circuit.

According to another aspect of the present invention, there is provided a semiconductor chip in which the semiconductor cell for photomask data verification described above is provided at a region different from a region of the semiconductor integrated circuit or at a region where a function of the semiconductor integrated circuit is not disturbed.

According to still another aspect of the present invention, there is provided a semiconductor chip in which the semiconductor cell for photomask data verification according to claim 1 is divided into plural pieces and provided at a region different from a region of the semiconductor integrated circuit or at a region where a function of the semiconductor integrated circuit is not disturbed.

According to an embodiment of the present invention, with only the verification of the semiconductor cell for photomask data verification, it is possible to easily verify whether the arithmetic processing for converting layout data into photomask data is properly performed without disturbing the functions of the semiconductor integrated circuits of the semiconductor chip and spending a lot of time searching for a relevant circuit element of the semiconductor integrated circuits.

Other objects, features and advantages of the present invention will become more apparent from the following detailed description when read in conjunction with the accompanying drawings.

BRIEF DESCRIPTION OF THE DRAWINGS

FIGS. 9A and 9B are plan views explaining the semiconductor cell for photomask data verification according to the embodiment of the present invention and schematically showing the layout data of contacts before being subjected to OPC processing and the photomask data of the contacts after being subjected to the OPC processing;

FIGS. 10A and 10B are plan views explaining the semiconductor cell for photomask data verification according to the embodiment of the present invention and schematically showing the layout data of metal wirings before the insertion of dummy metals and the photomask data of the metal wirings after the insertion of the dummy metals, respectively;

DETAILED DESCRIPTION OF THE PREFERRED EMBODIMENTS

Next, referring to the accompanying drawings, a description is made of the best mode for carrying out the present invention.

Embodiment

Referring to FIGS. 4 through 11, a semiconductor cell for photomask data verification and a semiconductor chip according to an embodiment of the present invention are described.

Figure 1:
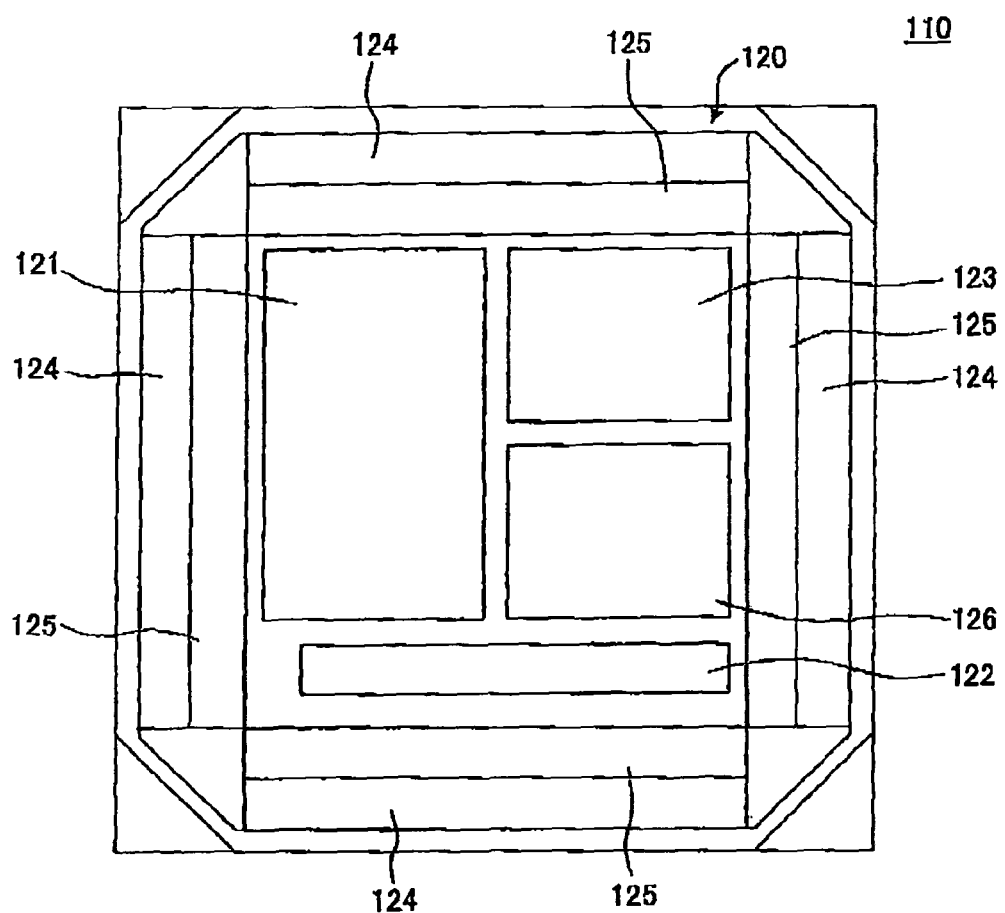
FIG. 1 is a plan view showing a circuit configuration of a conventional semiconductor chip.
Figure 2:
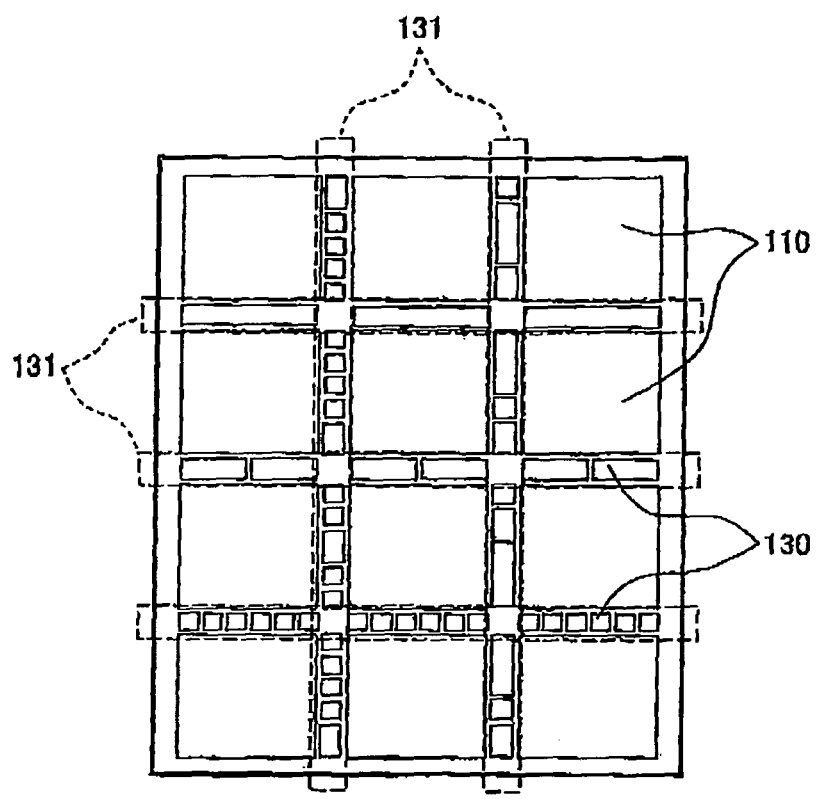
FIG. 2 is a diagram showing an example of a method for integrating the layout data of a conventional semiconductor chip as a semiconductor cell different from a semiconductor circuit.
Figure 3A:
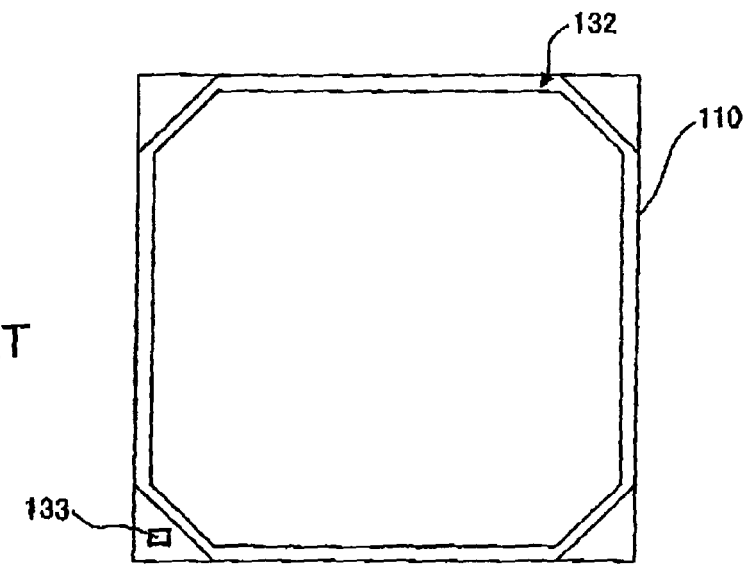
FIGS. 3A and 3B are diagrams showing an example of the method for integrating the layout data of the conventional semiconductor chip as the semiconductor cell different from the semiconductor circuit.
Figure 3B:
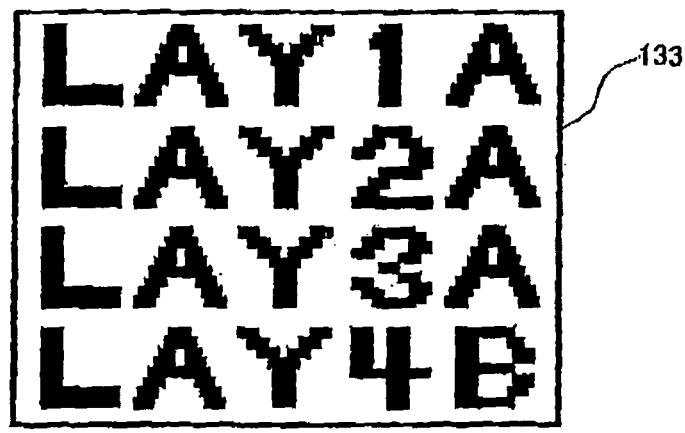
Figure 4:
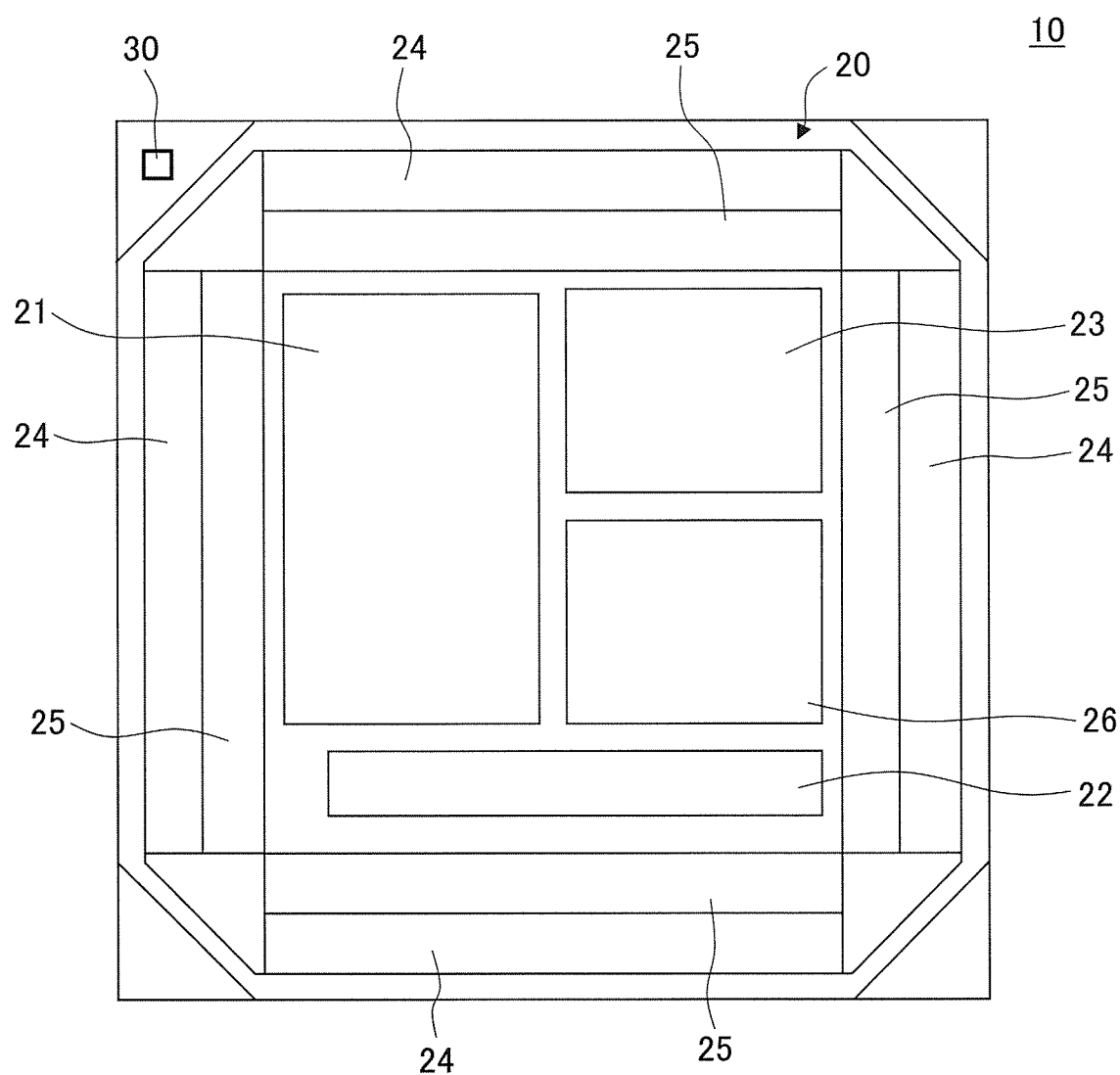
FIG. 4 is a plan view schematically showing a circuit configuration in the photomask data of a semiconductor chip according to an embodiment of the present invention.
Figure 5:
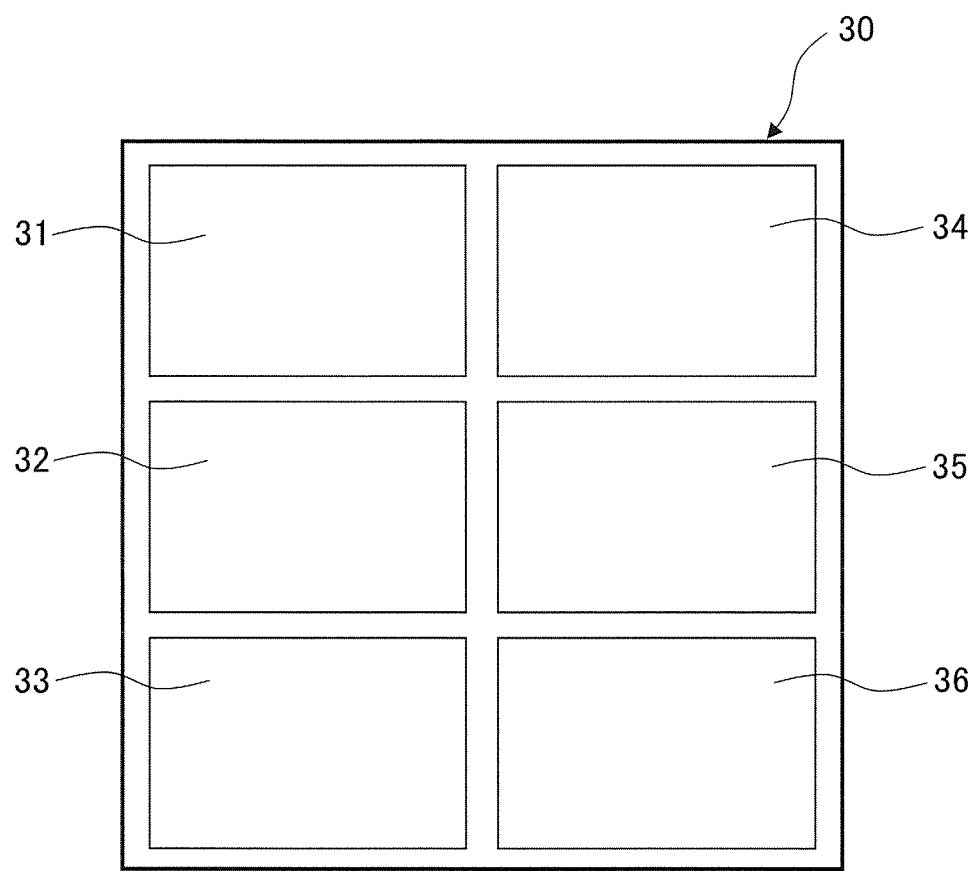
FIG. 5 is a plan view schematically showing a circuit configuration in the photomask data of a semiconductor cell for photomask data verification according to the embodiment of the present invention.

Referring first to FIGS. 4 and 5, the circuit arrangements of the semiconductor cell for photomask data verification and the semiconductor chip according to the embodiment are described.

FIG. 4 is a plan view schematically showing a circuit configuration in the photomask data of the semiconductor chip according to the embodiment, and FIG. 5 is a plan view schematically showing a circuit configuration in the photomask data of the semiconductor cell for photomask data verification according to the embodiment.

As shown in FIG. 4, the semiconductor chip 10 according to the embodiment has a semiconductor integrated-circuit region 20 and a semiconductor cell 30 for photomask data verification. The semiconductor integrated-circuit region 20 is provided at the central part of the semiconductor chip 10 and occupies most of the area of the semiconductor chip 10. On the other hand, the semiconductor cell 30 for photomask data verification is provided at a region different from the semiconductor integrated-circuit region 20 of the semiconductor chip 10, i.e., at the peripheral part of the semiconductor chip 10.

The semiconductor integrated-circuit region 20 has various semiconductor integrated circuits having specific functions, such as a digital circuit 21, a SRAM circuit 22, an analog circuit 23, an I/O cell circuit 24, a high voltage circuit 25, and other circuits 26. The semiconductor integrated circuits are provided so as to be separated from each other in plan view.

As shown in FIG. 5, the semiconductor cell 30 for photomask data verification according to the embodiment has circuit element verification regions corresponding to the semiconductor integrated circuits constituting the semiconductor integrated-circuit region 20. In other words, the circuit element verification regions are a digital-circuit-element verification region 31, a SRAM-circuit-element verification region 32, an analog-circuit-element verification region 33, an I/O-cell-circuit-element verification region 34, a high-voltage-circuit-element verification region 35, and an other-circuits-element verification region 36. Furthermore, the circuit element verification regions are provided so as to be separated from each other in plan view.

The semiconductor integrated circuits such as the digital circuit 21, the SRAM circuit 22, the analog circuit 23, the I/O cell circuit 24, the high voltage circuit 25, and the other circuits 26 constituting the semiconductor integrated-circuit region 20 are composed of circuit elements such as transistors, capacitors, inductors, and wirings. The photomask data of the semiconductor integrated-circuit region 20 are obtained by performing arithmetic processing on the layout data of the circuit elements. Furthermore, the layout data of the circuit elements have the data of plural layers.

On the other hand, the circuit element verification regions such as the digital-circuit-element verification region 31, the SRAM-circuit-element verification region 32, the analog-circuit-element verification region 33, the I/O-cell-circuit-element verification region 34, the high-voltage-circuit-element verification region 35, and the other-circuits-element verification regions 36, which constitute the semiconductor cell 30 for photomask data verification, are composed of circuit elements such as transistors, capacitors, inductors, and wirings constituting the semiconductor integrated circuits. In addition, in order to verify the results of the arithmetic processing in which layout data are converted into photomask data in the semiconductor integrated circuit region 20, the layout data of the circuit elements constituting the circuit element verification regions of the semiconductor cell 30 for photomask data verification are the same as those of the circuit elements constituting the semiconductor integrated circuits.

Furthermore, the semiconductor cell 30 for photomask data verification is used for confirming the shape of photomask data corresponding to the semiconductor integrated circuit region 20 of the semiconductor chip 10. Accordingly, the circuit elements included in the circuit element verification regions of the semiconductor cell 30 for photomask data verification are electrically separated from each other or separated from the semiconductor integrated circuits of the semiconductor integrated circuit region 20.

In addition, the semiconductor cell 30 for photomask data verification has the circuit element verification regions corresponding to all the types of the circuit elements included in the semiconductor integrated-circuit region 20. Moreover, the photomask data of the semiconductor cell 30 for photomask data verification have a layer configuration in which the arithmetic processing is performed using the data of all the layers constituting the layout data of the circuit elements.

Note that in order to confirm whether the arithmetic processing for converting the layout data of the circuit elements into the photomask data is properly performed, it is only necessary to use the layout data of the minimum number of the circuit elements. Therefore, if there are the same types of the circuit elements in the semiconductor integrated-circuit region 20, the circuit elements except one can be omitted. As a result, the area of the semiconductor cell 30 for photomask data verification can be reduced and provided at the peripheral part of the semiconductor chip 10.

Furthermore, the semiconductor cell 30 for photomask data verification is not limited to the one in which the circuit elements are necessarily arranged so as to be separated for the respective circuit element verification regions corresponding to the respective semiconductor integrated circuits. However, if the circuit elements are provided so as to be separated for the respective circuit element verification regions as shown in FIG. 5, the arithmetic processing for converting layout data into photomask data can be more easily performed.

Next, a description is made of an example of a specific circuit element capable of verifying photomask data using the semiconductor cell 30 for photomask data verification.

(CMOS Circuits Having Different Threshold Voltages)

Referring first to FIGS. 6 through 8A-8F, a description is made of an example of providing photomask data obtained by performing the arithmetic processing on the layout data of CMOS circuits having different threshold voltages in the semiconductor cell for photomask data verification.

Figure 6:
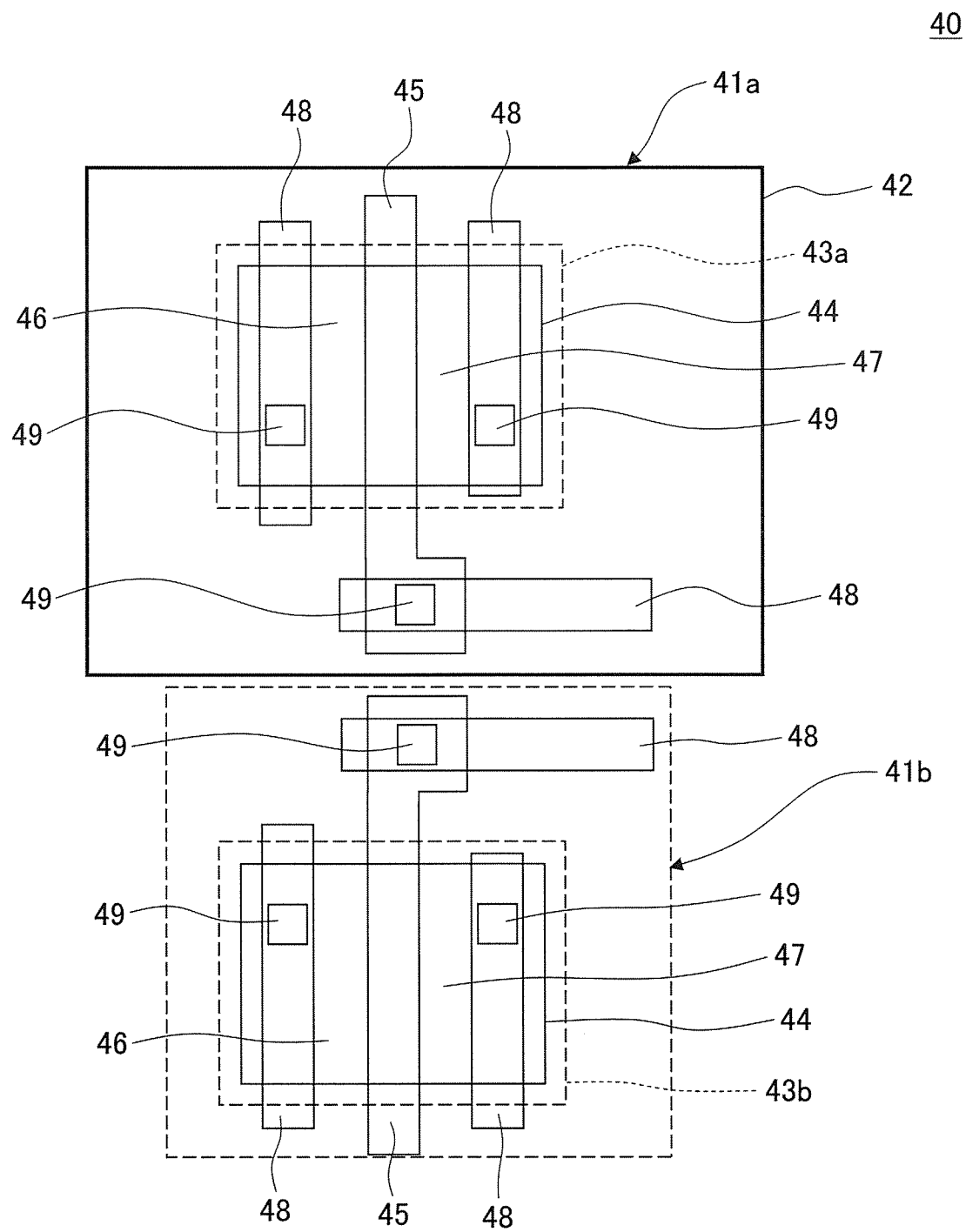
FIG. 6 is a plan view explaining the semiconductor cell for photomask data verification according to the embodiment of the present invention and schematically showing the layout data of a CMOS circuit.
Figure 7:
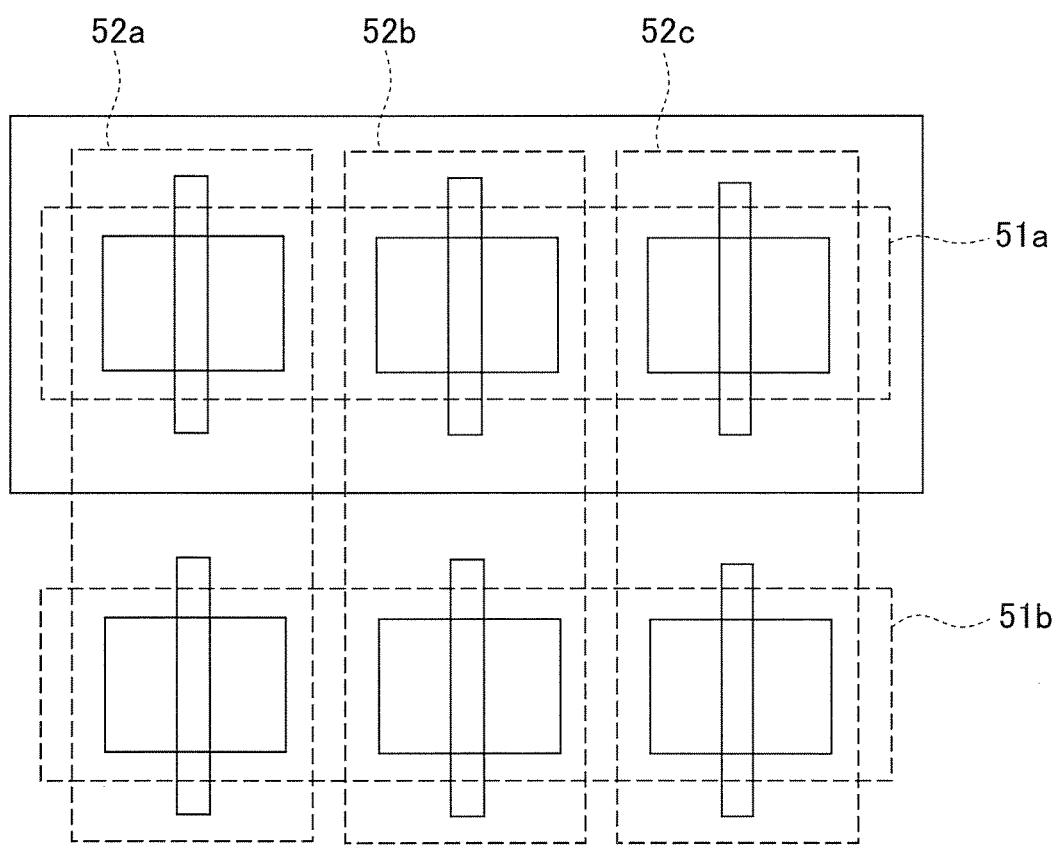
FIG. 7 is a plan view explaining the semiconductor cell for photomask data verification according to the embodiment of the present invention and schematically showing a state in which the CMOS circuits having different threshold voltages are arranged side by side.
Figures 8A, 8B, 8C, 8D, 8E, 8F:
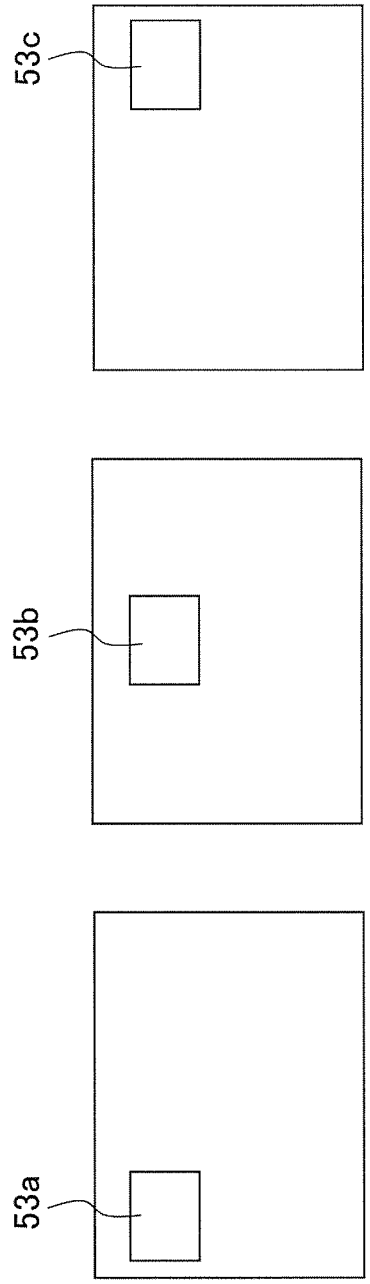
FIGS. 8A through 8F are plan views explaining the semiconductor cell for photomask data verification according to the embodiment of the present invention and schematically showing the photomask data of the CMOS circuits having different threshold voltages.

FIG. 6 is a plan view schematically showing the layout data of the CMOS circuit. FIG. 7 is a plan view schematically showing a state in which the CMOS circuits having different threshold voltages are provided side by side. FIGS. 8A through 8F are plan views schematically showing the photomask data of the CMOS circuits having different threshold voltages.

As shown in FIG. 6, a PMOS transistor 41a and an NMOS transistor 41b are provided side by side in the CMOS circuit 40. In the arrangement of the PMOS transistor 41a, three rectangular regions, i.e., an N-well 42, a P-ion injection region 43a, and a diffusion region 44 are provided from the outside toward the inside. In addition, a gate electrode 45 is provided so as to divide the P-ion injection region 43a and the diffusion region 44 each into right and left regions with a center line. Moreover, at upper parts of the gate electrode 45, a source region 46 and a drain region 47 as the diffusion regions formed when the P-ion injection region 43a and the diffusion region 44 are each divided into the right and left regions, contacts 49 for connecting the source region 46 and the drain region 47 to a metal wiring 48 are provided.

The arrangement of the NMOS transistor 41b is the same as that of the PMOS transistor 41a except that it does not have the N-well 42 and replaces the P-ion injection region 43a with an N-ion injection region 43b.

Accordingly, the layout data of the CMOS circuit 40 has the data of an N-well layer, a P-well layer, a diffusion layer, a gate-electrode layer, a P-ion injection layer, an N-ion injection layer, a contact layer, and a metal wiring layer.

The data of the layers are named, for example, as "Nwell," "Pwell," "Diffusion," "Poly," "P+Ion injection," "N+Ion injection," "Contact," and "Metal layer of each hierarchy," respectively, and converted into a GDS format so as to constitute one layout data set. In order to generate one piece of mask data constituting photomask data, the data of the layer required for generating the mask data are extracted from the layout data in the GDS format and subjected to arithmetic processing.

Next, a description is made of generating, through arithmetic processing on the layout data in the GDS format, the mask data of the P-ion injection region and the N-ion injection region of the semiconductor integrated circuit having three types of CMOSs whose threshold voltages of transistors are different. In this case, each of the PMOS and NMOS requires three types of MOSs of a Low Vth (LVt) MOS as a low threshold voltage MOS, a High Vth (HVt) MOS as a high threshold voltage MOS, and a Standard Vth (SVt) MOS as a standard threshold voltage MOS. As shown in FIG. 7, the regions of "P+Ion injection" 51a and "N+Ion injection" 51b are each divided into an LVt Layer 52a, an HVt Layer 52b, and an SVt Layer 52c. Along with this division of the regions, six types of the mask data of "PMOS LVt" 53a, "PMOS HVt" 53b, "PMOS SVt" 53c, "NMOS LVt" 53d, "NMOS HVt" 53e, and "NMOS SVt" 53f as shown in FIGS. 8A through 8F are required. In order to generate the six types of the mask data, it is necessary to perform arithmetic processing on the data of two types of the layers "P+Ion injection" and "N+Ion injection" constituting the layout data in the GDS format. Specifically, the arithmetic processing is performed using the following functions to generate the six types of the mask data.

PMOS LVt=P+Ion injection and LVt Layer

PMOS HVt=P+Ion injection and HVt Layer

PMOS SVt=P+Ion injection and SVt Layer

NMOS LVt=N+Ion injection and LVt Layer

NMOS HVt=N+Ion injection and HVt Layer

NMOS SVt=N+Ion injection and SVt Layer

Here, the semiconductor integrated circuit having the three types of CMOSs is provided in the semiconductor integrated-circuit region 20. At the same time, the circuit element verification region corresponding to the semiconductor integrated circuit having the three types of CMOSs is also provided in the semiconductor cell 30 for photomask data verification, and the circuit elements corresponding to the three types of CMOSs are provided in the circuit element verification region. Accordingly, with the verification of the photomask data of the semiconductor cell 30 for photomask data verification, it is possible to easily verify whether there is any error in the results obtained by performing the arithmetic processing on the layout data with respect to all the mask data of "PMOS LVt" 53a, "PMOS HVt" 53b, "PMOS SVt" 53c, "NMOS LVt" 53d, "NMOS HVt" 53e, and "NMOS SVt" 53f included in the semiconductor integrated-circuit region 20.

(Contacts Subjected to OPC Processing)

Referring next to FIGS. 9A and 9B, a description is made of an example of providing the photomask data of contacts subjected to OPC processing in the semiconductor cell for photomask data verification.

FIGS. 9A and 9B are plan views schematically showing the layout data of the contacts before being subjected to the OPC processing and the photomask data of the contacts after being subjected to the OPC processing.

The OPC processing refers to optical proximity correction. When the pattern of a photomask is transferred onto a silicon wafer by reduced projection exposure, distortion in an exposure shape called an optical proximity effect occurs. That is, when the size of the exposure shape (exposure size on the wafer) comes close to or becomes smaller than the wavelength of exposure light, the shape of the pattern of the photomask cannot be faithfully exposed due to the diffraction phenomenon of light, which results in the occurrence of the distortion in the exposure shape on the wafer. Accordingly, in order to obtain a desired exposure shape, it is necessary to correct a mask shape in consideration of the distortion. The correction in consideration of such an influence by the diffraction of light is called the optical proximity correction or the OPC processing.

In various semiconductor integrated circuits including the above CMOS circuits, contacts are formed. As shown in FIG. 9A, the sizes of contacts 49a in the layout data are the same. However, as shown in FIG. 9B, the sizes of contacts 49b in the photomask data obtained through the OPC processing are different. This is because the contacts are subjected to the OPC processing so as to be as close to the same size as possible on the silicon wafer in a semiconductor chip manufacturing process.

The semiconductor integrated circuit having the contacts 49b obtained through the OPC processing is provided in the semiconductor integrated circuit region 20. At the same time, the circuit element verification region corresponding to the semiconductor integrated circuit having the contacts 49b obtained through the OPC processing is also provided in the semiconductor cell 30 for photomask data verification, and the contacts 49b obtained through the OPC processing are provided in the circuit element verification region. Accordingly, with the verification of the photomask data of the semiconductor cell 30 for photomask data verification, it is possible to easily verify whether there is any error in the results obtained by performing the arithmetic processing on the layout data with respect to the mask data of all the contacts included in the semiconductor integrated-circuit area 20.

(Dummy Metals)

Referring next to FIGS. 10A and 10B, a description is made of an example of providing the photomask data of metal wirings into which dummy metals are inserted in the semiconductor cell for photomask data verification.

FIGS. 10A and 10B are plan views schematically showing the layout data of the metal wirings before the insertion of the dummy metals and the photomask data of the metal wirings after the insertion of the dummy metals, respectively.

The insertion of the dummy metals is to provide metals irrelevant to the transmission of electric signals for the purpose of improving the flatness of the surface of a semiconductor chip at the time of chemical mechanical polishing. In some cases, it is called metal fill.

The insertion of the dummy metals is performed when the layout data of the metal wirings are converted into the photomask data. As shown in FIG. 10A, in the layout data of the metal wirings before converted into the photomask data, only the metal wirings 48 are provided. On the other hand, as shown in FIG. 10B, in the photomask data of the metal wirings, the dummy metals 54 other than the metal wirings 48 are inserted when the layout data of the metal wirings 48 are converted into the photomask data.

Note that in some cases, the layout data are constituted of a prohibition layer (metal dummy block) that prevents the insertion of the dummy metals. In this case, the prohibition layer itself where the insertion of the dummy metals is prevented does not become mask data. However, in the region of the prohibition layer, the insertion of the dummy metals is prevented. Prohibition layer regions 55 at the left lower parts of FIGS. 11A and 11B show regions where the insertion of the dummy metals is prevented based on arithmetic processing using the prohibition layer.

The semiconductor integrated circuit having the metal wirings into which the dummy metals are inserted is provided in the semiconductor integrated circuit region 20. At the same time, the circuit element verification region corresponding to the semiconductor integrated circuit having the metal wirings into which the dummy metals are inserted is also provided in the semiconductor cell 30 for photomask data verification, and the metal wirings into which the dummy metals are inserted are provided in the circuit element verification region. Accordingly, with the verification of the photomask data of the semiconductor cell 30 for photomask data verification, it is possible to easily verify whether there is any error in the results obtained by performing the arithmetic processing on the layout data with respect to the metal wirings into which all the dummy metals included in the semiconductor integrated-circuit area 20 are inserted.

In addition, if the semiconductor integrated circuit region 20 of the semiconductor chip 10 has CMOS regions of two types of power supply voltages of, for example, 1.0 V and 3.0 V, the layers of "Nwell," "Diffusion," "Poly," "Various Ions injection," and "high voltage region" can be provided, and the transistors of 1.0 VNMOS/PMOS and 3.3 VNMOS/PMOS can be provided as the circuit elements in the layers. Moreover, even in the MOS of 1.0 V, the transistors of "LVt," "HVt," and "SVt" having different threshold voltages can be provided. In addition, capacitors formed of metal wirings and resistance elements formed of "Poly" and "Nwell" can be provided. Inductors formed of spiral-shaped metal wirings can also be provided. With all these types of circuit elements, the semiconductor cell 30 for photomask data verification according to the embodiment is realized.

Figure 11:
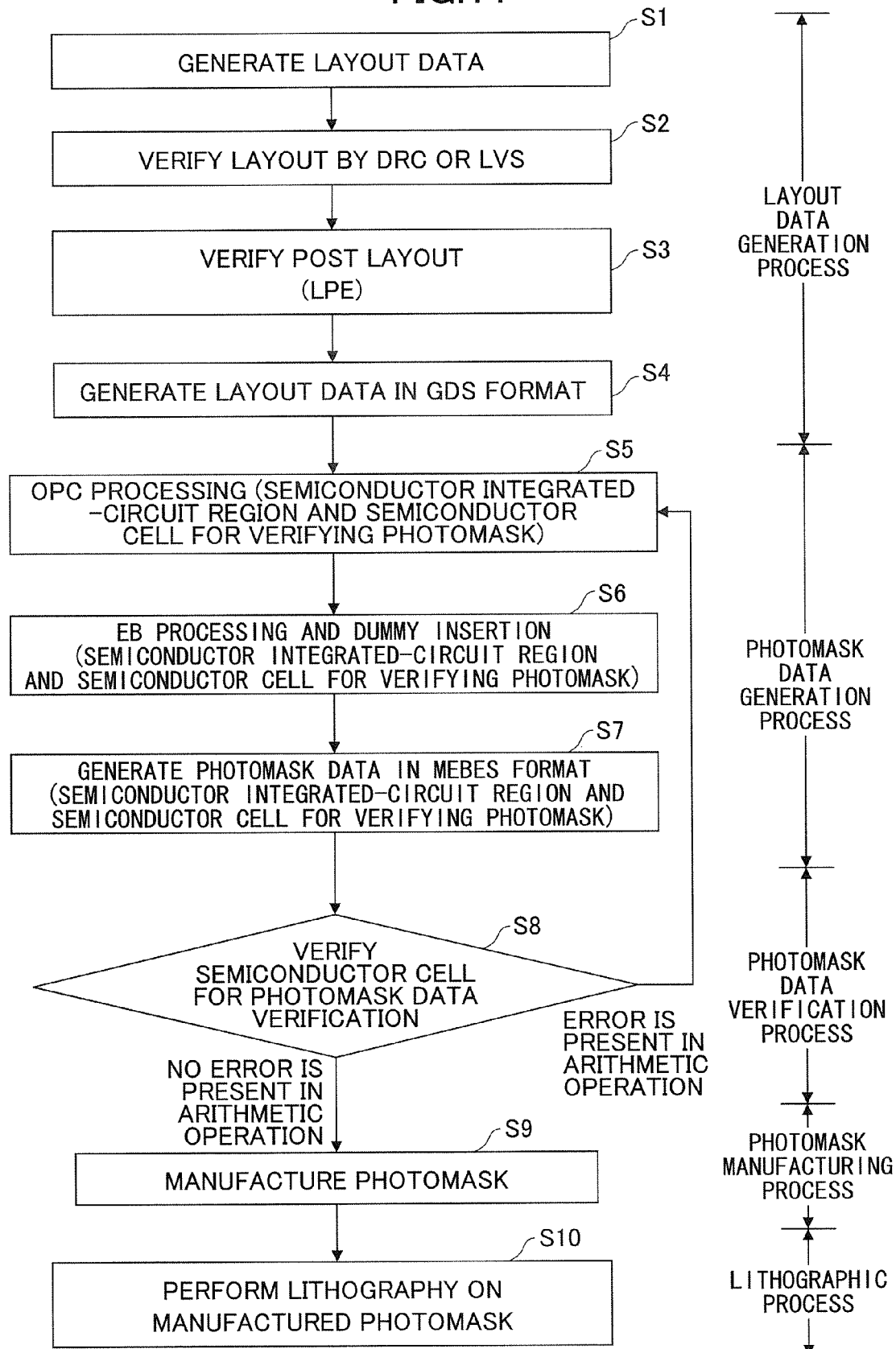
FIG. 11 is a flowchart showing a method for verifying photomask data using the semiconductor cell for photomask data verification according to the embodiment of the present invention.

Referring next to FIG. 11, a description is made of a method for verifying photomask data using the semiconductor cell for photomask data verification.

FIG. 11 is a flowchart showing a part of the semiconductor chip manufacturing process including a verification process for the semiconductor cell for photomask data verification according to the embodiment. In FIG. 11, processes from the generation of the layout data of a semiconductor chip to the manufacturing of a photomask are shown. The processes are specifically described below.

As shown in FIG. 11, in the semiconductor chip manufacturing process including the verification process for the semiconductor cell for photomask data verification according to the embodiment, there are a layout data generation process including steps S1 through S4, a photomask data generation process including steps S5 through S7, a photomask data verification process including step S8, a photomask manufacturing process including step S9, and a lithographic process including step S10.

First, the layout data generation process including steps S1 through S4 is performed.

In the layout data generation process, a layout is first manually or automatically generated based on various parameters of a circuit design using a layout generation tool (such as "L-Edit Pro" manufactured by Tanner Research, Inc., "CeltIC" manufactured by Cadence Design Systems, Inc., and "Astro" manufactured by Synopsys, Inc.,) (step S1). Next, the generated layout is verified using a method such as DRC (design rule check) or LVS (layout VS circuit check) (step S2). Here, DRC and LVS are performed by CAD processing using a layout verification tool (such as "Dracula" manufactured by Cadence Design Systems, Inc., "Calibre" manufactured by Mentor Graphics Corp., and "Hercules" manufactured by Avanti) that carries out DRC and LVS in accordance with a predetermined rule file. Then, post layout verification (LPE) is performed to verify the arrangements of transistors and the resistances and capacities of wirings (step S3). Through the above processes, layout data in the GDS format are generated (step S4).

Next, the photomask data generation process including steps S5 through S7 is performed. The photomask data generation process is performed with respect to the whole semiconductor chip. In other words, the photomask data generation process is performed with respect to both of the semiconductor integrated-circuit region 20 and the semiconductor cell 30 for photomask data verification of the semiconductor chip 10 shown in FIG. 4.

In the photomask data generation process, the OPC (optical proximity correction) processing is first performed to correct the shapes of wirings and pads (step S5). Next, EP processing is performed to change a format for a photomask manufacturing apparatus (actually, a reticle manufacturing apparatus) (step S6). Moreover, the GDS format (a normal layout format) is converted into a format for the photomask manufacturing apparatus such as a MEBES format to generate photomask data (step S7).

Then, the photomask data verification process including step S8 is performed.

In the photomask data verification process, the semiconductor cell for photomask data verification is verified (step S8). That is, the photomask data in the semiconductor cell for photomask data verification are verified to confirm whether there is any error in the results of the arithmetic processing. As described above, the photomask data have a format such as MEBES and JOEL. The photomask data having such a format are displayed on a display unit through dedicated viewer software so that photomask data shape can be visually identified. In addition, the viewer software has a length-measuring function with which quantitative dimensional analysis of the photomask data can be performed.

Specifically, when the mask data of "A and B" obtained by performing the arithmetic processing on layers A and B are verified, it is confirmed whether the data of the layers A and B are processed into a desired shape, a part to be subjected to the OPC processing is totally processed, etc.

Note that the arithmetic processing for converting the layout data into the photomask data is collectively performed with respect to the whole semiconductor chip. For example, assuming that a circuit element having the layout data constituted of the data of the layers A and B is provided in both of the semiconductor integrated-circuit region 20 and the semiconductor cell 30 for photomask data verification of the semiconductor chip 10 shown in FIG. 4, when the arithmetic processing on "A and B" is performed with respect to the layout data of the semiconductor integrated-circuit region 20, the layout data of the semiconductor cell 30 for photomask data verification are also subjected to the arithmetic processing on "A and B." Accordingly, when the region corresponding to "A and B" of the semiconductor cell 30 for photomask data verification is verified, it is possible to easily verify whether there is any error in the results obtained by performing the arithmetic processing on the layout data in the region corresponding to "A and B" of the semiconductor integrated-circuit region 20.

Next, the photomask manufacturing process including step S9 is performed.

If there is no error in the results of the arithmetic processing in the photomask data verification process, the photomask manufacturing process is performed by a known method using the obtained photomask data (step S9).

On the other hand, if there is any error in the results of the arithmetic processing in the photomask data verification process, the process does not proceed to the photomask manufacturing process. Instead, the process returns to step S5 of the photomask data generation process to correct a part in which there is any error in the results of the arithmetic processing on the photomask data. At last, lithography is performed on the manufactured photomask (step S10). Accordingly, with the verification of the photomask data of the semiconductor cell for photomask data verification, it is possible to confirm the results of the arithmetic processing for converting the layout data into the photomask data in the whole semiconductor chip prior to the generation of the photomask. In other words, compared with a case in which when any error is found in the results in the arithmetic processing on the photomask data, the photomask data are generated again, the photomask is manufactured again after the photomask has been manufactured, and then the semiconductor chip manufacturing process is started using the newly manufactured photomask, it is possible to greatly reduce time and manufacturing costs with the semiconductor chip manufacturing process according to the embodiment.

As described above, according to the semiconductor cell for photomask data verification and the semiconductor chip of the embodiment, the circuit element verification regions corresponding to the semiconductor integrated circuits of the semiconductor chip are also provided in the semiconductor cell for photomask data verification, and the circuit elements corresponding to the semiconductor integrated circuits are provided in the circuit element verification regions. Therefore, with the verification of the photomask data of the semiconductor cell for photomask data verification, it is possible to substitute for the verification of the photomask data of the semiconductor integrated circuits and more easily verify the photomask data.

First Modification of the Embodiment

Figure 12:
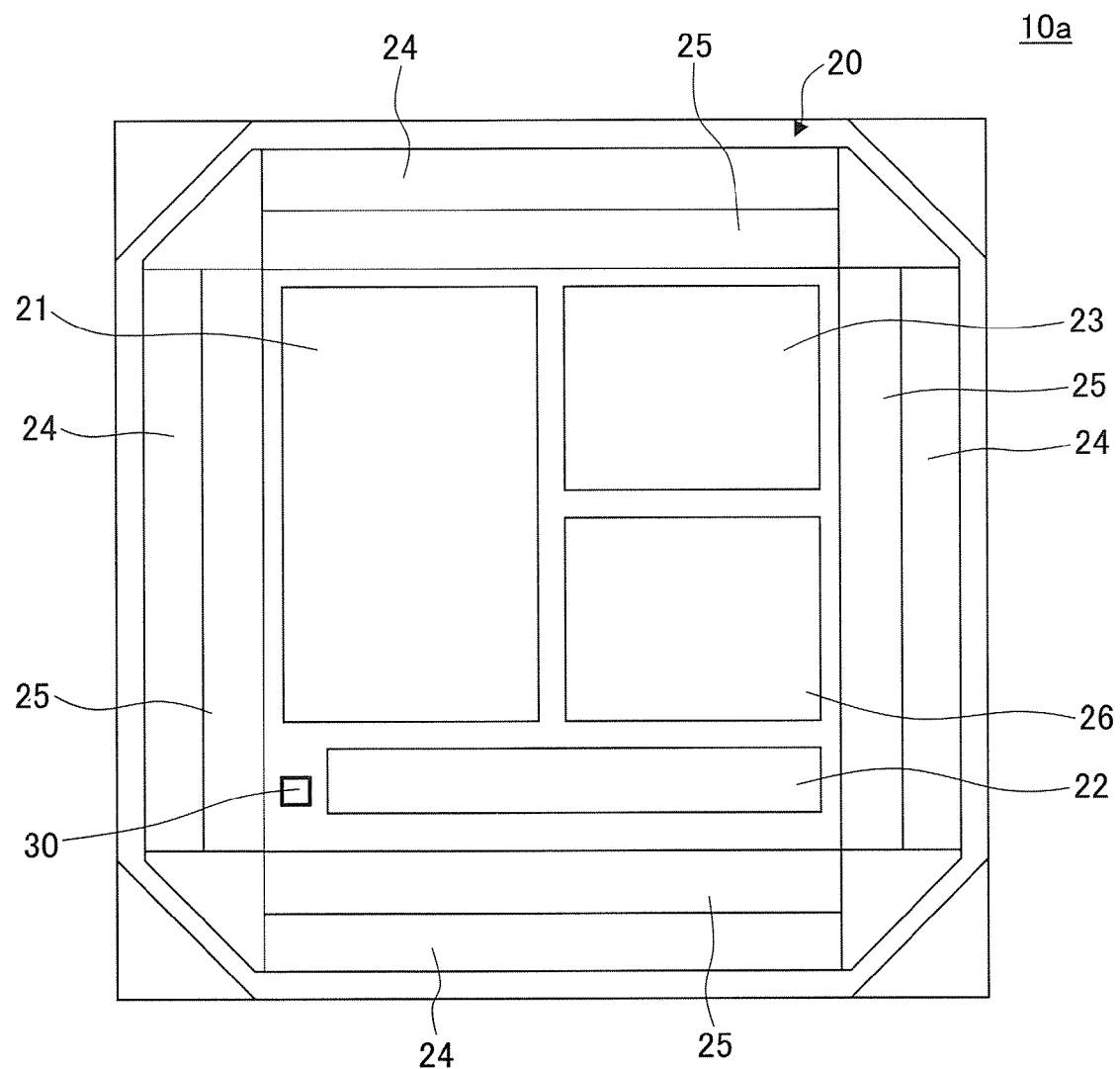
FIG. 12 is a plan view schematically showing a circuit configuration in the photomask data of a semiconductor chip according to a modification of the embodiment of the present invention.

Referring next to FIGS. 5 and 12, a first modification of the embodiment is described.

FIG. 12 is a plan view schematically showing a circuit configuration in the photomask data of a semiconductor chip according to this modification. In the following description, however, components similar to those described in the embodiment are denoted by the same reference numerals and their descriptions may be omitted (the same applies to the following modifications).

In addition, the circuit arrangement in the photomask data of a semiconductor cell for photomask data verification according to this modification is the same as that of the embodiment. Therefore, a plan view schematically showing the circuit arrangement in the photomask data of the semiconductor cell for photomask data verification is that shown in FIG. 5.

The semiconductor chip according to this modification is different from the semiconductor chip according to the embodiment in that the semiconductor cell for photomask data verification is provided in the semiconductor integrated-circuit region of the semiconductor chip.

As apparent from FIG. 12, unlike the embodiment in which the semiconductor cell for photomask data verification is provided at the peripheral part of the semiconductor chip, a semiconductor chip 10a according to this modification has the characteristic of providing the semiconductor cell 30 for photomask data verification at the same region as the semiconductor integrated-circuit region 20, where the functions of the semiconductor integrated circuits are not disturbed.

As shown in FIG. 12, similar to the case of the semiconductor chip 10 according to the embodiment, the semiconductor chip 10a according to this modification has the semiconductor integrated-circuit region 20 and the semiconductor cell 30 for photomask data verification. The semiconductor integrated-circuit region 20 is provided at the central part of the semiconductor chip 10a and occupies most of the area of the semiconductor chip 10a. On the other hand, in this modification, the semiconductor cell 30 for photomask data verification is provided at the same region as the semiconductor integrated-circuit region 20, where the functions of the semiconductor integrated circuits are not disturbed.

Similar to the case of the embodiment, the semiconductor integrated-circuit region 20 has various semiconductor integrated circuits having specific functions, such as the digital circuit 21, the SRAM circuit 22, the analog circuit 23, the I/O cell circuit 24, the high voltage circuit 25, and the other circuits 26. The semiconductor integrated circuits are composed of circuit elements such as transistors, capacitors, inductors, and wirings. In addition, similar to the case of the embodiment, the photomask data of the semiconductor integrated-circuit region 20 are obtained by performing the arithmetic processing on the layout data of the circuit elements, and the layout data of the circuit elements have the data of the plural layers.

On the other hand, as shown in FIG. 5, similar to the case of the embodiment, the semiconductor cell 30 for photomask data verification according to this modification has the circuit element verification regions corresponding to the semiconductor integrated circuits constituting the semiconductor integrated-circuit region 20, i.e., the digital-circuit-element verification region 31, the SRAM-circuit-element verification region 32, the analog-circuit-element verification region 33, the I/O-cell-circuit-element verification region 34, the high-voltage-circuit-element verification region 35, and the other-circuits-element verification region 36. In addition, similar to the case of the embodiment, the circuit elements constituting the semiconductor integrated circuits included in the semiconductor integrated-circuit region 20 are provided in the circuit element verification regions, and the photomask data of the semiconductor cell 30 for photomask data verification are obtained by performing the arithmetic processing on the layout data of the circuit elements.

Furthermore, the semiconductor cell 30 for photomask data verification is used for confirming the shape of photomask data corresponding to the semiconductor integrated circuit region 20 of the semiconductor chip 10a. Accordingly, the circuit elements included in the circuit element verification regions of the semiconductor cell 30 for photomask data verification are electrically separated from each other or separated from the semiconductor integrated circuit region 20.

Note that in order to confirm whether the arithmetic processing for converting the layout data of the circuit elements into the photomask data is properly performed, it is only necessary to use the layout data of the minimum number of the circuit elements. Therefore, if there are the same types of the circuit elements in the semiconductor integrated-circuit region 20, the circuit elements except one can be omitted. As a result, the area of the semiconductor cell 30 for photomask data verification can be reduced and provided at the same region as the semiconductor integrated-circuit region 20, where the functions of the semiconductor integrated circuits are not disturbed. Specifically, as shown in FIG. 12, the semiconductor cell 30 for photomask data verification can be provided at a space of the semiconductor integrated-circuit region 20, such as a gap between the semiconductor integrated circuits. Even if the semiconductor cell 30 for photomask data verification cannot be provided at the peripheral part of the semiconductor chip 10a for some reason, it can be provided at a space of the semiconductor integrated-circuit region 20. Therefore, photomask data can be more flexibly designed.

Furthermore, the semiconductor cell 30 for photomask data verification is not limited to the one in which the circuit elements are necessarily arranged so as to be separated for the respective circuit element verification regions corresponding to the respective semiconductor integrated circuits. However, if the circuit elements are provided so as to be separated for the respective circuit element verification regions as shown in FIG. 5, the arithmetic processing for converting layout data into photomask data can be more easily performed.

As described above, according to the semiconductor cell for photomask data verification and the semiconductor chip of this modification, the semiconductor cell for photomask data verification can be provided at a space of the semiconductor integrated-circuit region. Therefore, even if the semiconductor cell for photomask data verification cannot be provided at the peripheral part of the semiconductor chip for any reason such as a special restriction, verification as to whether the arithmetic processing for converting the photomask data into the layout data is properly performed can be easily performed.

Second Modification of the Embodiment

Figure 13:
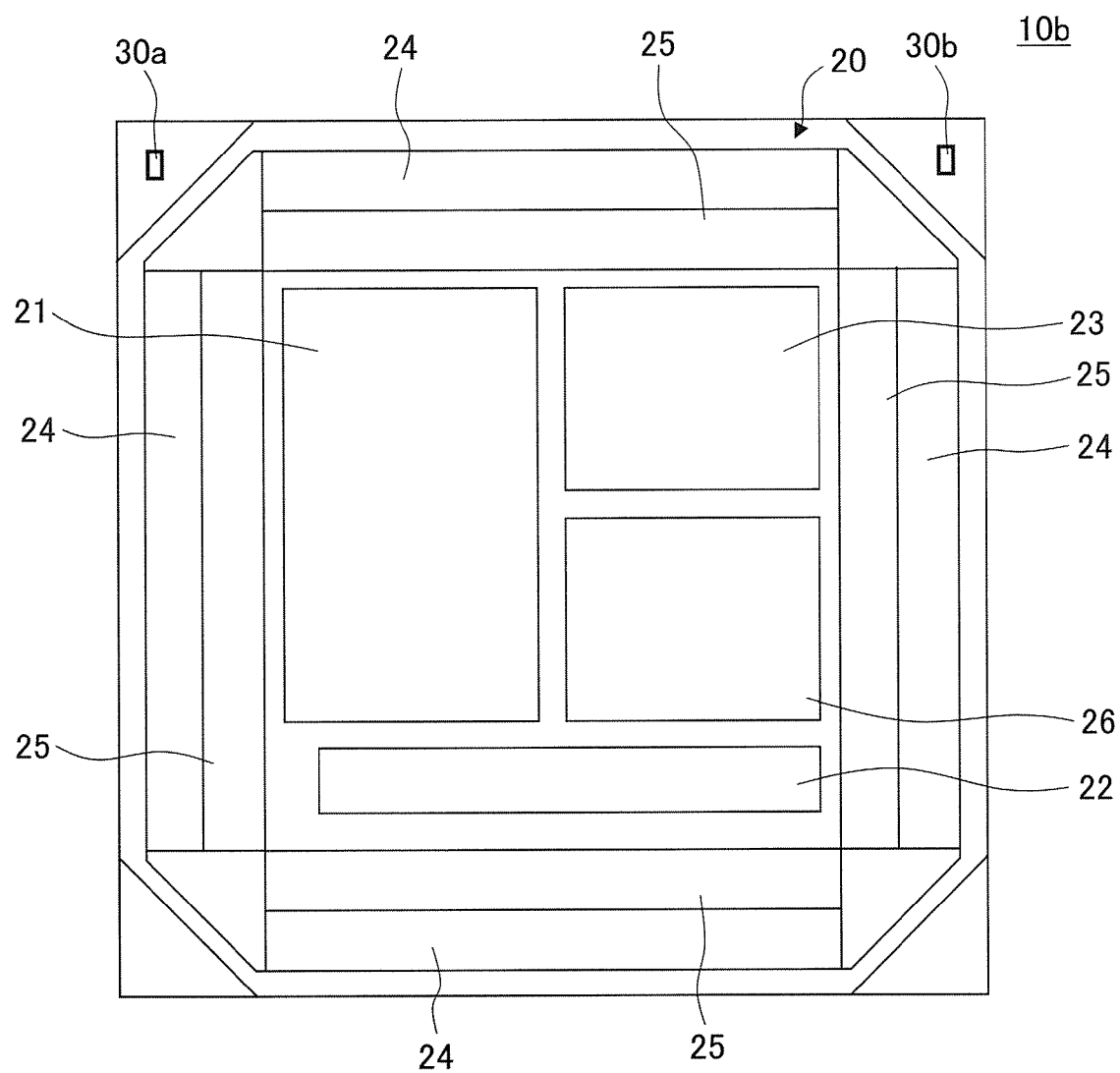
FIG. 13 is a plan view schematically showing a circuit configuration in the photomask data of a semiconductor chip according to a second modification of the embodiment of the present invention.
Figure 14A:
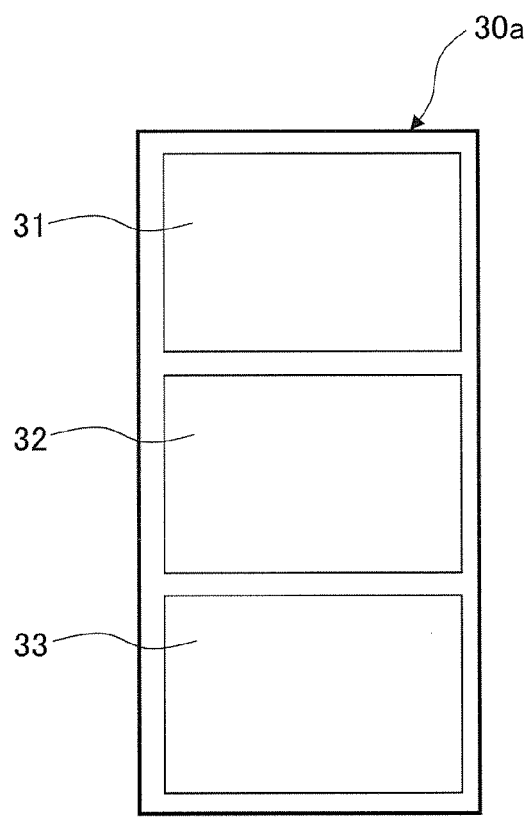
FIGS. 14A and 14B are plan views schematically showing a circuit configuration in the photomask data of a semiconductor cell for photomask data verification according to the second modification of the embodiment of the present invention.
Figure 14B:
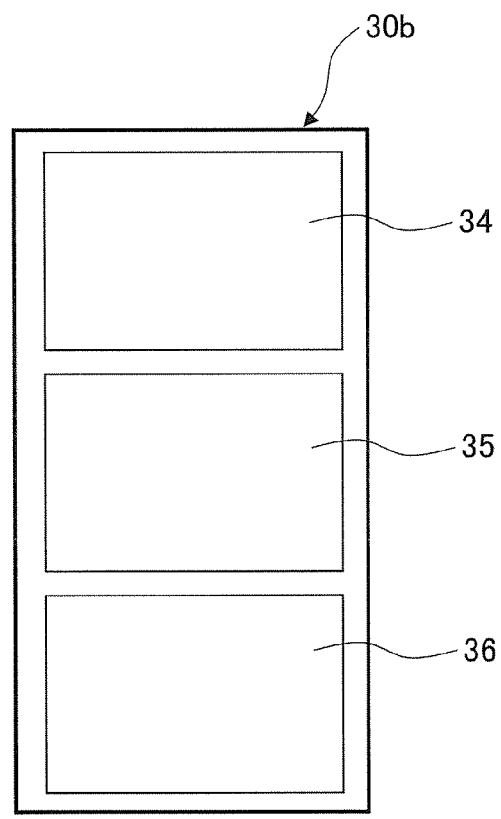

Referring next to FIGS. 13, 14A, and 14B, a second modification of the embodiment is described.

FIG. 13 is a plan view schematically showing a circuit configuration in the photomask data of a semiconductor chip according to this modification, and FIGS. 14A and 14B are plan views schematically showing a circuit configuration in the photomask data of a semiconductor cell for photomask data verification according to this modification.

The semiconductor chip according to this modification is different from the semiconductor chip according to the embodiment in that the semiconductor cell for photomask data verification is divided into plural pieces and provided at the peripheral part of the semiconductor chip.

As apparent from FIG. 13, unlike the embodiment in which the semiconductor cell for photomask data verification is provided at one place of the peripheral part of the semiconductor chip, a semiconductor chip 10b according to this modification has the characteristic of providing the plural pieces of divided semiconductor cells 30 for photomask data verification at regions different from the semiconductor integrated-circuit region 20, i.e., at plural places of the peripheral part of the semiconductor chip 10b.

As shown in FIG. 13, the semiconductor chip 10b according to this modification has the semiconductor integrated-circuit region 20 and semiconductor cells 30a and 30b for photomask data verification. The semiconductor integrated-circuit region 20 is provided at the central part of the semiconductor chip 10b and occupies most of the area of the semiconductor chip 10b. On the other hand, the semiconductor cell for photomask data verification is divided into two pieces and provided at the regions different from the semiconductor integrated-circuit region 20 of the semiconductor chip 10b, i.e., at two places of the peripheral part of the semiconductor chip 10b.

Similar to the case of the embodiment, the semiconductor integrated-circuit region 20 has various semiconductor integrated circuits having specific functions, such as the digital circuit 21, the SRAM circuit 22, the analog circuit 23, the I/O cell circuit 24, the high voltage circuit 25, and the other circuits 26.

On the other hand, as shown in FIGS. 14A and 14B, the semiconductor cell for photomask data verification is divided into the two pieces of semiconductor cells 30a and 30b for photomask data verification. As shown in FIG. 14A, the semiconductor cell 30a for photomask data verification has the digital-circuit-element verification region 31, the SRAM-circuit-element verification region 32, and the analog-circuit-element verification region 33. Furthermore, as shown in FIG. 14B, the semiconductor 30b for photomask data verification has the I/O-cell-circuit-element verification region 34, the high-voltage-circuit-element verification region 35, and the other-circuits-element verification regions 36.

Here, if there are so many types of the circuit elements in the semiconductor integrated circuits of the semiconductor integrated-circuit region 20, the number of all the types of the circuit elements, which are required for confirming whether the arithmetic processing for converting the layout data of the circuit elements into the photomask data is properly performed, is very large. This results in an increase in the area of the semiconductor cell 30 for photomask data verification. Therefore, the semiconductor cell 30 for photomask data verification can hardly be provided at one place of the peripheral part of the semiconductor chip. Furthermore, when the semiconductor integrated-circuit region occupies most of the area of the semiconductor chip 10b even if there are not so many types of the circuit elements in the semiconductor integrated circuits of the semiconductor integrated circuit region 20, the semiconductor cell 30 for photomask data verification can hardly be provided at one place of the peripheral part of the semiconductor chip. In order to deal with these problems, the semiconductor cell 30 for photomask data verification can be divided into plural pieces and provided at plural places of the peripheral part of the semiconductor chip 10b. Therefore, the photomask data can be more flexibly designed.

Here, as shown in FIGS. 14A and 14B, even if the semiconductor cell 30 for photomask data verification is divided into plural pieces, the circuit element verification regions are collectively provided for the circuit elements corresponding to the semiconductor integrated circuits of the semiconductor integrated circuit region 20. Therefore, compared with a case in which the circuit elements dispersed in the semiconductor integrated circuits of the semiconductor integrated circuit region 20 are searched and verified, the photomask data can be easily verified.

As described above, according to the semiconductor cell for photomask data verification and the semiconductor chip of this modification, the semiconductor cell for photomask data verification can be divided into the plural pieces and provided at the plural places of the peripheral part of the semiconductor chip. Therefore, even if there are many types of the circuit elements in the semiconductor integrated-circuit region, or even if the proportion of an area of the semiconductor integrated circuit region to an area of the semiconductor chip is large, it is possible to provide the semiconductor cell for photomask data verification and easily verify whether the arithmetic processing for converting the layout data into the photomask data is properly performed.

Note that in this modification, the two pieces of divided semiconductor cells for photomask data verification are provided at the peripheral part of the semiconductor chip. However, the semiconductor cell for photomask data verification may be divided into three or more pieces and provided at the peripheral part of the semiconductor chip.

In addition, when the semiconductor cell for photomask data verification is divided into plural pieces, at least one piece of semiconductor cell for photomask data verification may be provided not at the peripheral part of the semiconductor chip, but at the semiconductor integrated circuit region where the functions of the semiconductor integrated circuits are not disturbed.

Third Modification of the Embodiment

Figure 15:
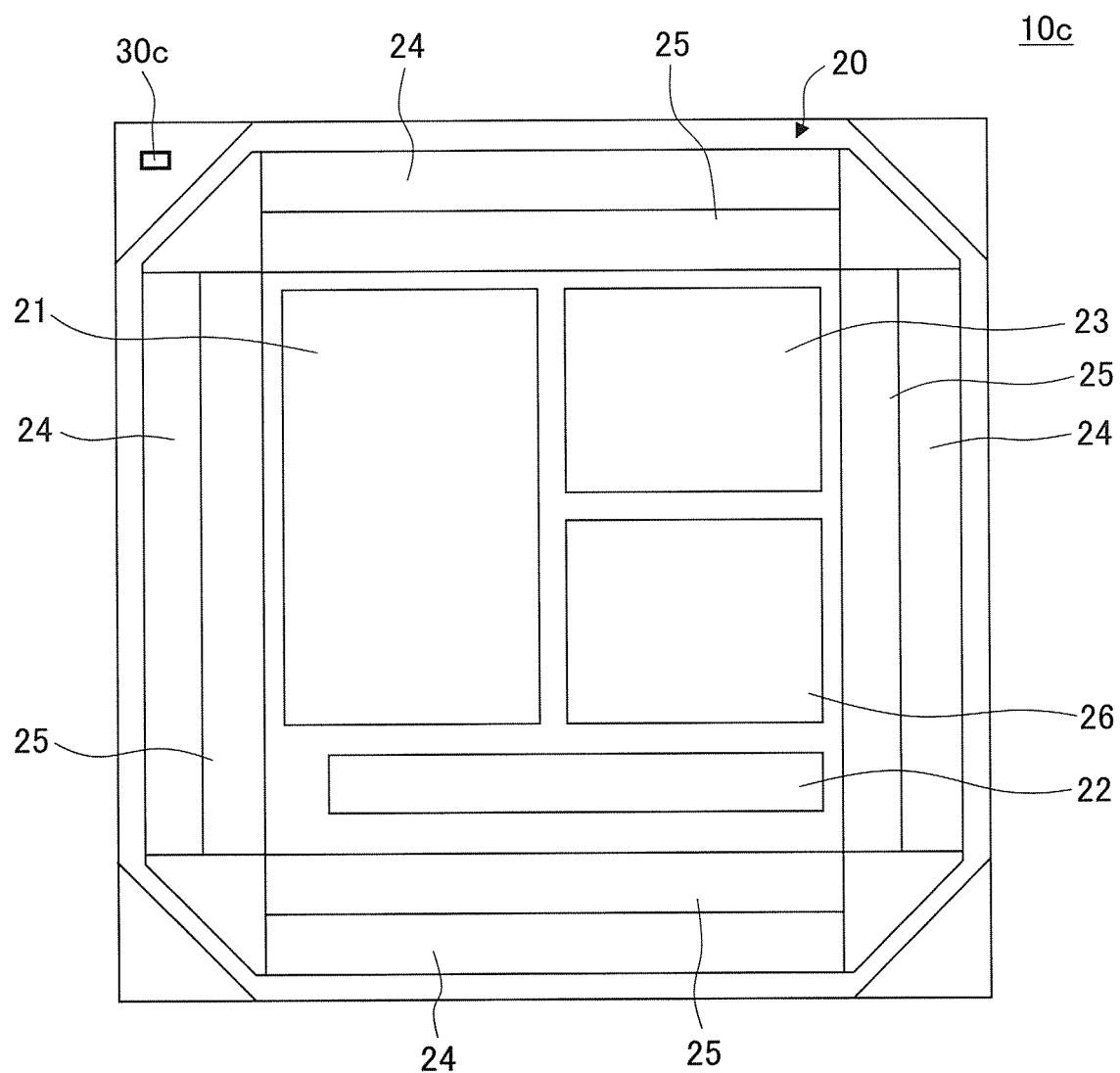
FIG. 15 is a plan view schematically showing a circuit configuration in the photomask data of a semiconductor chip according to a third modification of the embodiment of the present invention.
Figure 16:
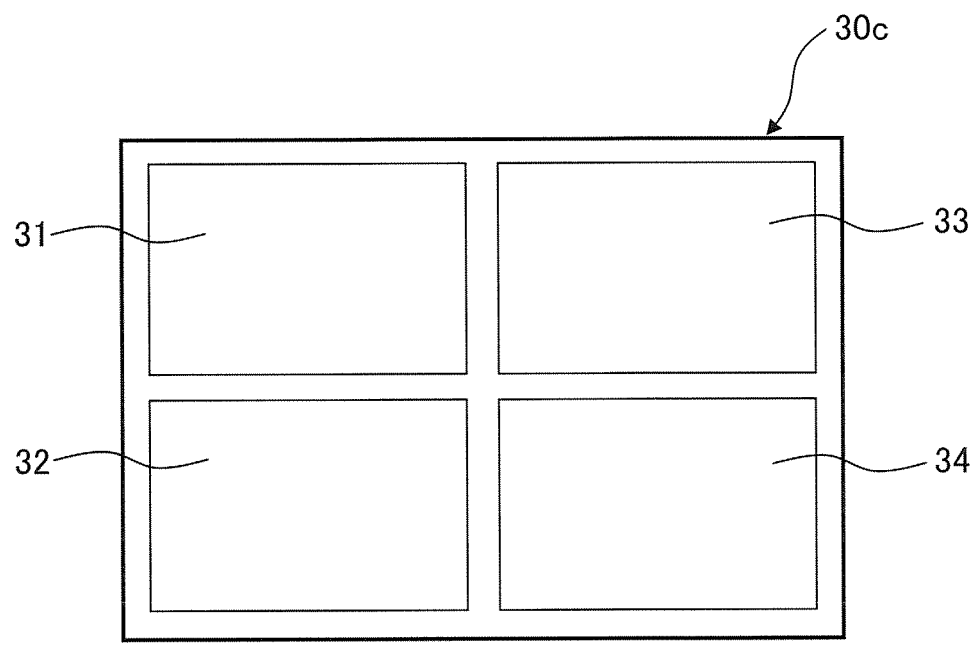
FIG. 16 is a plan view schematically showing a circuit configuration in the photomask data of a semiconductor cell for photomask data verification according to the third modification of the embodiment of the present invention.

Referring next to FIGS. 15 and 16, a third modification of the embodiment is described.

FIG. 15 is a plan view schematically showing a circuit configuration in the photomask data of a semiconductor chip according to this modification, and FIG. 16 is a plan view schematically showing a circuit configuration in the photomask data of a semiconductor cell for photomask data verification according to this modification.

The semiconductor chip according to this modification is different from the semiconductor chip according to the embodiment in that the semiconductor cell for photomask data verification has only the layout data of some of the circuit elements or the data of some of the layers included in the semiconductor integrated-circuit region.

According to the embodiment, the semiconductor cell for photomask data verification has the photomask data corresponding to the data of all the layers of all the types of the circuit elements included in the semiconductor integrated-circuit region. Therefore, the semiconductor cell for photomask data verification has all the circuit element verification regions corresponding to the semiconductor integrated circuits of the semiconductor integrated-circuit region. On the other hand, as shown in FIG. 15, the semiconductor cell for photomask data verification in a semiconductor chip 10c according to this modification has the photomask data corresponding to the layout data of some of the circuit elements or the data of some of the layers included in the semiconductor integrated-circuit region 20. Therefore, the semiconductor cell for photomask data verification has the characteristic of providing only the circuit element verification region corresponding to some of the semiconductor integrated circuits of the semiconductor integrated-circuit region 20.

As shown in FIG. 15, the semiconductor chip 10c according to this modification has the semiconductor integrated-circuit region 20 and a semiconductor cell 30c for photomask data verification. The semiconductor integrated-circuit region 20 is provided at the central part of the semiconductor chip 10c and occupies most of the area of the semiconductor chip 10c. On the other hand, the semiconductor cell 30c for photomask data verification is provided at a region different from the semiconductor integrated-circuit region 20 of the semiconductor chip 10c, i.e., at the peripheral part of the semiconductor chip 10c.

Similar to the case of the embodiment, the semiconductor integrated-circuit region 20 has various semiconductor integrated circuits having specific functions, such as the digital circuit 21, the SRAM circuit 22, the analog circuit 23, the I/O cell circuit 24, the high voltage circuit 25, and the other circuits 26.

On the other hand, as shown in FIG. 16, the semiconductor cell 30c for photomask data verification has the digital-circuit-element verification region 31, the SRAM-circuit-element verification region 32, the analog-circuit-element verification region 33, and the I/O-cell-circuit-element verification region 34.

For example, if some mask data constituting the photomask data of the semiconductor chip 10c are generated from the data of one layer of the layout data of one circuit element and the data of the layer of the layout data of the circuit element are not used for generating other mask data, the probability of causing an error in the results of the arithmetic processing due to the data of the layer is very low. Therefore, the data of the layer can be eliminated from the semiconductor cell 30c for photomask data verification. Similarly, it is not necessary to provide the data of all the layers of all the circuit elements in the semiconductor cell 30c for photomask data verification. Therefore, if only a necessary circuit element is selected and provided in the semiconductor cell 30 for photomask data verification, the area of the semiconductor cell 30c for photomask data verification can be made small. Then, if the necessary circuit element is provided in some of the semiconductor integrated circuits rather than all the semiconductor integrated circuits of the semiconductor integrated-circuit region 20, only the circuit element verification region corresponding to those some of the semiconductor integrated circuits need be provided as in the semiconductor cell 30c for photomask data verification according to this modification.

Furthermore, even when most of the mask data of the photomask data of an existing semiconductor chip are used but some of the mask data are changed using a new option layer, the semiconductor cell 30c for photomask data verification according to this modification can be provided as the semiconductor cell for photomask data verification for verifying only the mask data related to the layer.

According to the semiconductor cell for photomask data verification and the semiconductor chip according to this modification, only the data of the layer possibly causing an error in the arithmetic processing on the photomask data need be provided in the semiconductor cell for photomask data verification. Therefore, it is possible to reduce the area of the semiconductor cell for photomask data verification and more easily verify photomask data.

The present invention is not limited to the specifically disclosed embodiments, and variations and modifications may be made without departing from the scope of the present invention.

The present application is based on Japanese Priority Application No. 2008-015482 filed on Jan. 25, 2008, the entire contents of which are hereby incorporated herein by reference.

What is claimed is:

1. A semiconductor cell for photomask data verification that is provided in a semiconductor chip having a semiconductor integrated circuit and used for verifying photomask data of the semiconductor chip obtained by performing arithmetic processing on layout data of the semiconductor integrated circuit,
   the semiconductor cell for photomask data verification having
      the photomask data obtained by performing the arithmetic processing on the layout data of the semiconductor integrated circuit, and
      layout data of all types of MOS circuit elements constituting the semiconductor integrated circuit, and
      being electrically separated from the semiconductor integrated circuit.

2. The semiconductor cell for photomask data verification according to claim 1, wherein the layout data of the semiconductor integrated circuit including plural layers have some of or all data of the plural layers of the semiconductor integrated circuit.

3. The semiconductor cell for photomask data verification according to claim 1, wherein the layout data of the semiconductor integrated circuit including plural layers have layout data of all types of circuit elements constituting the semiconductor integrated circuit.

4. A semiconductor chip, comprising:
   a semiconductor cell for photomask data verification that is provided in the semiconductor chip having a semiconductor integrated circuit and used for verifying photomask data of the semiconductor chip obtained by performing arithmetic processing on layout data of the semiconductor integrated circuit, the semiconductor cell for photomask data verification having
      the photomask data obtained by performing the arithmetic processing on the layout data of the semiconductor integrated circuit, and
      layout data of all types of MOS circuit elements constituting the semiconductor integrated circuit, and
      being electrically separated from the semiconductor integrated circuit; and
   wherein the semiconductor cell for photomask data verification is provided at a region different from a region of the semiconductor integrated circuit or at a region where a function of the semiconductor integrated circuit is not disturbed.

5. A semiconductor chip, comprising:
   a semiconductor cell for photomask data verification that is provided in the semiconductor chip having a semiconductor integrated circuit and used for verifying photomask data of the semiconductor chip obtained by performing arithmetic processing on layout data of the semiconductor integrated circuit, the semiconductor cell for photomask data verification having
      the photomask data obtained by performing the arithmetic processing on the layout data of the semiconductor integrated circuit, and
      layout data of all types of MOS circuit elements constituting the semiconductor integrated circuit, and
      being electrically separated from the semiconductor integrated circuit; and
   wherein the semiconductor cell for photomask data verification is divided into plural pieces and provided at a region different from a region of the semiconductor integrated circuit or at a region where a function of the semiconductor integrated circuit is not disturbed.

* * * * *